(12) United States Patent
Zhang et al.

(10) Patent No.: US 9,423,701 B2
(45) Date of Patent: Aug. 23, 2016

(54) LITHOGRAPHIC METHOD AND ASSEMBLY

(75) Inventors: Shaoxian Zhang, Eindhoven (NL); Johannes Jacobus Matheus Baselmans, Oirschot (NL); Johannes Christiaan Maria Jasper, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 908 days.

(21) Appl. No.: 13/438,526

(22) Filed: Apr. 3, 2012

(65) Prior Publication Data

US 2012/0257182 A1    Oct. 11, 2012

Related U.S. Application Data

(60) Provisional application No. 61/472,045, filed on Apr. 5, 2011.

(51) Int. Cl.
*G03B 27/68* (2006.01)
*G03F 7/20* (2006.01)

(52) U.S. Cl.
CPC ............ *G03F 7/706* (2013.01); *G03F 7/70616* (2013.01); *G03F 7/70625* (2013.01)

(58) Field of Classification Search
CPC .. G03F 7/706; G03F 7/70616; G03F 7/70625
USPC ......................................................... 355/52
See application file for complete search history.

(56) References Cited

U.S. PATENT DOCUMENTS

| | | | |
|---|---|---|---|
| 6,063,531 A | 5/2000 | Singh et al. | |
| 6,897,947 B1 | 5/2005 | van der Laan et al. | |
| 7,042,550 B2 | 5/2006 | Lowisch et al. | |
| 2003/0048458 A1* | 3/2003 | Mieher | G03F 7/70625 356/601 |
| 2003/0112722 A1* | 6/2003 | Matsuura | G11B 7/0908 369/44.32 |

(Continued)

FOREIGN PATENT DOCUMENTS

| | | |
|---|---|---|
| CN | 1710491 | 12/2005 |
| CN | 1862383 | 11/2006 |

(Continued)

OTHER PUBLICATIONS

Nigel R. Farrar et al., "In-situ measurement of lens aberrations," Proc of SPIE, vol. 4000, Optical Microlithography XIII, ed. C. Progler, pp. 18-29 (Mar. 2000).

*Primary Examiner* — Deoram Persaud
(74) *Attorney, Agent, or Firm* — Pillsbury Winthrop Shaw Pittman LLP

(57) ABSTRACT

A lithographic method of determining a sensitivity of a property of a pattern feature to change in optical aberrations of a lithographic apparatus used to provide that pattern feature. The method includes controlling a configuration of the lithographic apparatus to establish a first aberration state, forming a first image of the pattern feature with that lithographic apparatus when the lithographic apparatus is in that first aberration state, measuring a property of the image, controlling a configuration of the lithographic apparatus to establish a second, different, aberration state, forming an image of the same pattern feature with that lithographic apparatus when the lithographic apparatus is in that second aberration state, measuring a same property of the image, and using the measurements to determine the sensitivity of the property of the pattern feature to changes in the aberration state.

15 Claims, 3 Drawing Sheets

(56) References Cited

U.S. PATENT DOCUMENTS

| | | | |
|---|---|---|---|
| 2003/0206289 A1* | 11/2003 | Matsuyama | G03F 7/706 356/124 |
| 2004/0032579 A1* | 2/2004 | Emer | G01M 11/0242 356/72 |
| 2004/0137677 A1 | 7/2004 | Lowisch et al. | |
| 2005/0076322 A1* | 4/2005 | Ye | G03F 7/705 716/52 |
| 2005/0237506 A1* | 10/2005 | Reisinger et al. | 355/55 |
| 2006/0169927 A1 | 8/2006 | Muraki et al. | |
| 2007/0203680 A1* | 8/2007 | Shin | G03F 7/70433 703/6 |
| 2009/0195764 A1* | 8/2009 | Takenaka | G03F 7/706 355/53 |
| 2009/0219494 A1* | 9/2009 | Kakuchi | G03F 7/706 355/18 |
| 2010/0177294 A1 | 7/2010 | Wang et al. | |

FOREIGN PATENT DOCUMENTS

| | | |
|---|---|---|
| CN | 1312464 | 4/2007 |
| JP | 2001-085305 | 3/2001 |
| JP | 2001-358059 | 12/2001 |
| JP | 2004-179663 | 6/2004 |
| JP | 2005-513757 | 5/2005 |
| JP | 2006-210503 | 8/2006 |
| JP | 2006-332168 | 12/2006 |
| JP | 2009-532888 | 9/2009 |
| JP | 2013-077637 | 4/2013 |

* cited by examiner

LITHOGRAPHIC METHOD AND ASSEMBLY

This application claims priority and benefit under 35 U.S.C. §119(e) to U.S. Provisional Patent Application No. 61/472,045, entitled "Lithographic Method and Assembly", filed on Apr. 5, 2011. The content of that application is incorporated herein in its entirety by reference.

FIELD

The present invention relates to a lithographic method and assembly.

BACKGROUND

A lithographic apparatus is a machine that applies a desired pattern onto a substrate, usually onto a target portion of the substrate. A lithographic assembly might be a lithographic apparatus, or might be a lithographic apparatus and additional equipment (e.g. a measuring tool, a radiation source, and the like). A lithographic apparatus can be used, for example, in the manufacture of integrated circuits (ICs). In that instance, a patterning device, which is alternatively referred to as a mask or a reticle, may be used to impart a beam of radiation with a pattern in its cross-section, the pattern corresponding to a circuit pattern to be formed on an individual layer of the IC. This pattern can be imaged or transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions (which might be dies) that are successively patterned. Known lithographic apparatus include so-called steppers, in which each target portion is irradiated by exposing an image of the entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In the semiconductor manufacturing industry there is increasing demand for ever-smaller features and increased density of features. The critical dimensions (CDs) are rapidly decreasing and are becoming very close to the theoretical resolution limit of state-of-the-art exposure tools such as steppers and scanners as described above. Conventional technologies aimed at enhancing resolution and minimizing printable CD include reducing the wavelength of the exposure radiation, increasing the numerical aperture (NA) of the projection system of the lithographic apparatus, and/or including features in a patterning device pattern smaller than the resolution limit of the exposure tool so that they will not print on the substrate, but so that they will produce diffraction effects which can improve contrast and sharpen fine features.

In order to help ensure that pattern features applied to a substrate are applied as intended (e.g. to ensure that critical dimension limits, requirements, or uniformities are met), it may be desirable to at least partially correct for aberrations in the lithographic apparatus. Aberrations may arise due to heating of one or more elements of a projection system of the lithographic apparatus due to the transmission or reflection of at least a portion of a radiation beam, and this heating may cause distortion or the like of those one or more elements. Alternatively and/or additionally, aberrations may arise for one or more other reasons, for example optical surfaces not performing in accordance with theory.

SUMMARY

The determination and control of optical aberrations may be important for improving lithographic performance. The impact of different types and/or magnitudes of aberrations is application specific. How a specific application (e.g. an application of a pattern to a substrate) responds to a certain aberration may be defined as aberration sensitivity. Aberration sensitivity may be determined from measurement (i.e. determination) of aberrations and/or changes in applied pattern features using a lithographic apparatus exhibiting those aberrations. Aberration sensitivity may be used in conjunction with correction of an aberration (or the effects of that aberration) to form an aberration control loop.

Aberration sensitivity may depend on one or more factors, for example an illumination mode used by the lithographic apparatus, one or more properties of a pattern feature to be applied to a substrate, one or more features of the substrate itself (for example, the composition or the like of resist), the quality or configuration of the patterning device, and/or a dose of radiation provided in any given exposure.

Since aberration sensitivity is a significant factor to be taken into account when applying a pattern to a substrate, there have been attempts to determine such aberration sensitivity. One approach to determining aberration sensitivity is to construct a model or simulation which allows that sensitivity to be determined in a theoretical manner. In rare cases, however, aberration sensitivity may be determined experimentally. An experimental method for achieving this determination involves applying pattern features to a substrate, and then measuring one or more properties of those pattern features to determine the aberration sensitivity. In more detail, a lithographic apparatus is controlled to establish a first aberration state (e.g. to establish a first set of aberration conditions). When the lithographic apparatus is in this state, pattern features are applied to a substrate. The lithographic apparatus is then controlled to establish a second, different, aberration state, and a second, different substrate is provided with pattern features when the lithographic apparatus is in this second aberration state. The pattern features applied to the different substrates are then inspected (e.g. one or more properties of the pattern features are measured) and compared to obtain a measure of the aberration sensitivity.

Although the experimental method may be used to obtain information related to the aberration sensitivity, the method is arguably slow and inefficient and may potentially be inaccurate.

It is desirable to provide, for example, a lithographic method and/or assembly which obviates or mitigates at least one problem of the art, whether identified herein or elsewhere, or which provides an alternative to an existing lithographic method or apparatus.

According to a first aspect, there is provided a lithographic method of determining a sensitivity of a property of a pattern feature to change in optical aberration of a lithographic apparatus used to provide that pattern feature, the method comprising: controlling a configuration of the lithographic apparatus to establish a first aberration state, and forming a first image of the pattern feature with that lithographic apparatus when the lithographic apparatus is in that first aberration state; measuring a property of the image; controlling a configuration of the lithographic apparatus to establish a second, different, aberration state, and forming an image of the same pattern feature with that lithographic apparatus when the lithographic apparatus is in that second aberration state; measuring a same property of the image; and using the measurements to determine the sensitivity of the property of the pattern feature to change in the aberration state. For instance, a pattern feature may be imaged on to a sensor constituting a part of the lithographic apparatus. The pattern feature may be a pattern feature that is to be applied to a substrate, or could be an alignment mark.

According to a second aspect, there is provided a lithographic method of determining a sensitivity of a property of a pattern feature applied to a substrate to change in optical aberration of a lithographic apparatus used to apply that pattern feature, the method comprising: controlling a configuration of the lithographic apparatus to establish a first aberration state, and applying a pattern feature to a first target portion of the substrate when the lithographic apparatus is in that first aberration state; controlling a configuration of the lithographic apparatus to establish a second, different, aberration state, and applying a pattern feature to a second, different, target portion of the same substrate when the lithographic apparatus is in that second aberration state; measuring a property of the pattern feature applied to the first target portion of the substrate; measuring a same property of the pattern feature applied to the second target portion of the substrate; and using the measurements to determine the sensitivity of the property of the pattern feature to change in the aberration state.

An aberration constituting the first and/or second aberration state may be quantifiable.

A type and/or magnitude an aberration constituting the first and/or second aberration state is predictable, and/or is known prior to application of the pattern feature.

A difference between the first aberration state and the second aberration state may be a difference in a magnitude and/or type of an aberration constituting the first and/or second aberration state.

The controlling of the configuration of the lithographic apparatus may comprise continuously varying the aberration state to provide the first aberration state and, at a later time, the second, different, aberration state.

The controlling of the configuration of the lithographic apparatus may comprise discretely varying the aberration state to provide the first aberration state and, at a later time, the second, different, aberration state.

The controlling of the configuration of the lithographic apparatus may comprise moving (e.g. up or down, left or right) or deforming one or more elements of a lens arrangement of the lithographic apparatus, or heating one or more portions of the lens arrangement. Moving of the one or more elements includes changing the position and/or orientation of such element (e.g. by tilting). Controlling of the configuration of the lithographic apparatus may, alternatively or additionally, comprise moving a patterning device or a part thereof (which includes changing the position and/or orientation of such a device, or a part thereof (e.g. by tilting), adjusting the wavelength of the radiation beam, and/or changing an optical property of a liquid used in the optical path.

The substrate may be a test substrate.

The method may further comprise using the determined sensitivity as part of an aberration control loop.

The aberration control loop may comprise using the determined sensitivity to control an aberration state of the lithographic apparatus during the subsequent application of patterns to a different substrate.

The method may be repeated for a third, fourth or fifth aberration state and a corresponding third, fourth or fifth target portion of the substrate, or for at least, in total, 5, 10, 15, 20, 50, 100, 200 or more aberration states and target portions, all on a single substrate.

Each target portion of the substrate may be a die.

The property of the pattern feature may be one or more selected from: a sharpness of the pattern feature (e.g. an edge of the pattern feature), a dimension of the pattern feature, a shape of the pattern feature, a position of the pattern feature. 'Shape', includes side wall angle and height (e.g. due to resist loss). If no pattern feature is provided on a substrate, but instead is imaged on to a sensor, the pattern feature measured might additionally and/or alternatively be related to an intensity of radiation forming that image.

The aberration state may comprise an even aberration or an odd aberration. The aberration state may comprise or be defined by a specific aberration in terms of Zernike polynomials, such as lower order coma aberration. The aberration state may comprise or be defined by a combination of multiple Zernike polynomials. Odd aberrations relate to the affecting of in plane placement/displacement and asymmetries. Even aberrations relate to the affecting of out of plane placement/displacement (e.g. focus/defocus related aberrations) and asymmetries.

According to a third aspect, there is provided a lithographic assembly comprising: an illumination system to condition a radiation beam; a patterning device to impart the radiation beam with a pattern in its cross-section; a substrate holder to hold a substrate; a projection system to project the patterned radiation beam onto a target portion of the substrate, and a controller constructed and arranged to, in use, control a configuration of the lithographic assembly to establish a first aberration state for the application of a pattern feature to a first target portion of the substrate when the lithographic apparatus is in that first aberration state; and to control a configuration of the lithographic apparatus to establish a second, different, aberration state for the application of a pattern feature to a second, different, target portion of the same substrate when the lithographic apparatus is in that second aberration state.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
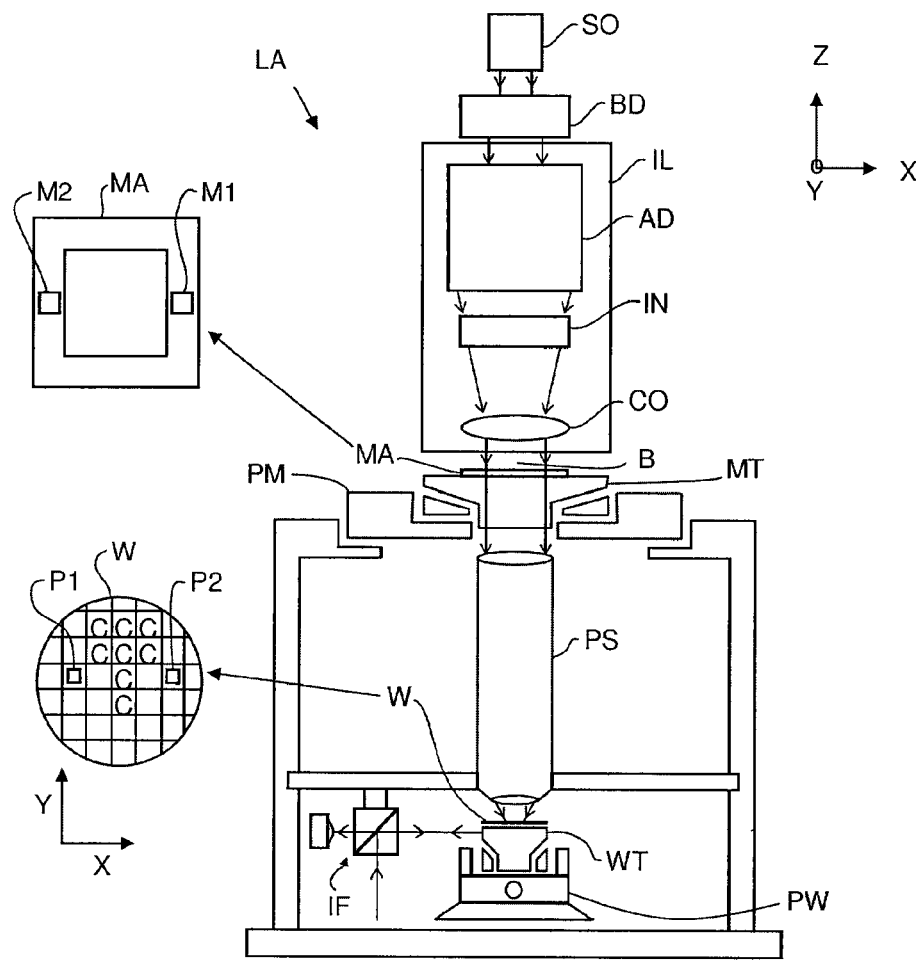
FIG. 1 schematically depicts a lithographic apparatus for use in conjunction with implementing an embodiment of the present invention.

FIG. 1 schematically depicts a lithographic apparatus LA according to an embodiment of the invention. The apparatus LA comprises:

an illumination system (illuminator) IL configured to condition a radiation beam B (e.g. UV radiation, for example generated by an excimer laser operating at a wavelength of 248 nm or 193 nm, or extreme ultraviolet (EUV) radiation, for example generated by a laser-fired plasma source operating at about 13.6 nm wavelength);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus LA is of a transmissive type (e.g. employing a transmissive mask). Alternatively, the apparatus may be of a reflective type (e.g. employing a programmable mirror array of a type as referred to above, or employing a reflective mask).

The lithographic apparatus LA may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus LA may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device table MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus LA could be used in at least one of the following modes:

In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
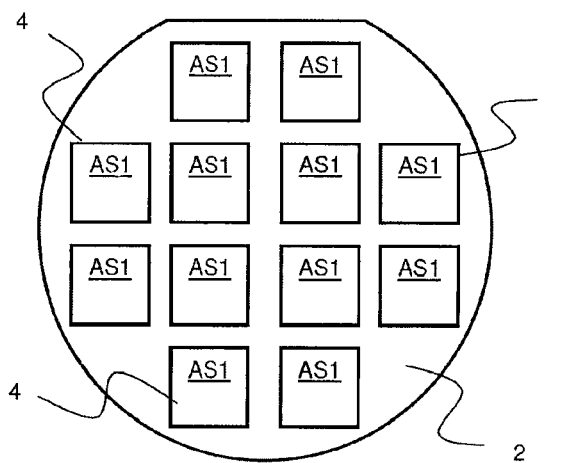
FIG. 2 schematically depicts a first substrate in plan view, illustrating principles associated with a method of determining aberration sensitivity.
Figure 3:
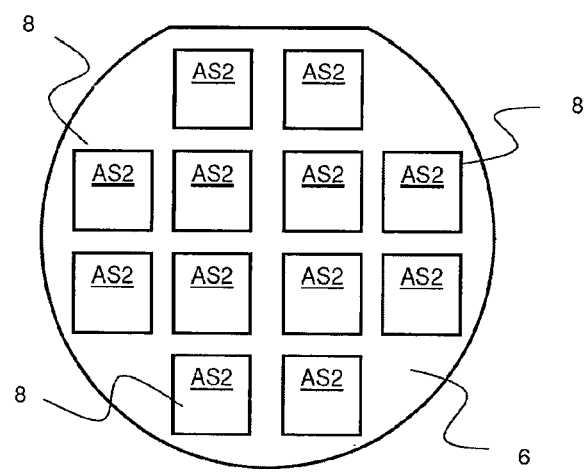
FIG. 3 schematically depicts a second substrate in plan view, illustrating further principles associated with the method of determining aberration sensitivity.
Figure 4:
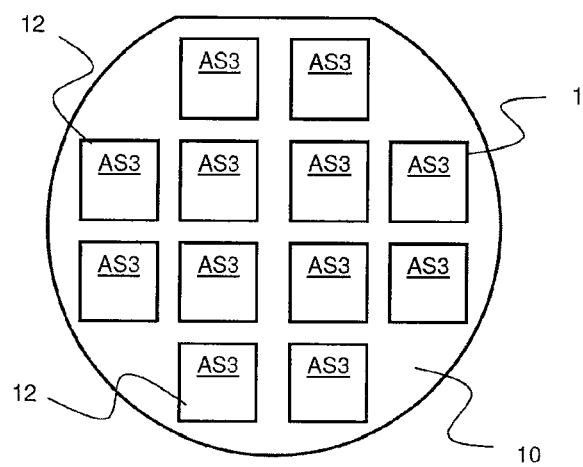
FIG. 4 schematically depicts a third substrate in plan view, illustrating further principles associated with the method of determining aberration sensitivity.

In order to help ensure that pattern features are applied to a substrate as intended, it may be desirable to at least partially correct for aberrations in or of the lithographic apparatus used to apply those patterns. How a pattern feature (or a property of that pattern feature) responds to an aberration, or a change in an aberration, is definable as aberration sensitivity. FIGS. 2 to 4 schematically depict an experimental approach to determining aberration sensitivity.

FIG. 2 schematically depicts a substrate 2, for example the substrate shown in and described with reference to FIG. 1. A configuration of a lithographic apparatus (e.g. the lithographic apparatus as shown in and described with reference to FIG. 1) is controlled to establish a first aberration state. This means that the lithographic apparatus has a first set of aberration conditions, for example exhibiting a certain type or magnitude of one or more aberrations. When the lithographic apparatus is in this first aberration state, one or more pattern features are applied to each of a number of target portions 4 on a substrate 2. The target portions 4 may, for example, be dies.

FIG. 2 shows that for each target portion 4 the one or more pattern features that have been applied to that target portion 4 have been applied when the lithographic apparatus was in a first aberration state AS1.

Once the pattern features have been applied and appropriately processed, one or more properties of the pattern features of one or more target portions may be measured, for example a sharpness of a pattern feature, a dimension of a pattern feature, or a shape of a pattern feature. The measurements are then recorded for future use. One or more of these properties may include, or be described more specifically as (e.g. for one-dimensional features): a placement; a width; a sidewall angle; a resist loss/height; any other shape change, and/or (e.g. for two-dimensional features) a resist volume; a relative position; a relative width; a resist remaining in between features ("bridging").

A configuration of the lithographic apparatus is then controlled to establish a second, different, aberration state. FIG. 3 schematically depicts a second substrate 6 (different to the substrate shown in FIG. 2). The lithographic apparatus, when exhibiting the second aberration state, is used to apply one or more pattern features to each of a number of target portions 8 of that substrate 6. Each of the pattern features for each of the target portions 8 will thus have been applied when the lithographic apparatus exhibits the second aberration state AS2.

Once the pattern features have been applied and appropriately processed, one or more properties of the pattern features of one or more target portions may be measured, for example a sharpness of a pattern feature, a dimension of a pattern feature, or a shape of a pattern feature. The measurements are then recorded for future use. The property or properties that is or are measured will correspond with the property or properties measured for the pattern features of the target portions of the first substrate of FIG. 2.

The above-described method may then be repeated for any number of different aberration states that the lithographic apparatus is controlled to exhibit. For example, FIG. 4 shows a third substrate 10 on to which one or more pattern features have been provided in each of a number of target portions 12 when the lithographic apparatus exhibits a third aberration state AS3. Again, one or more properties of the pattern features will be measured and recorded. The property or properties that is or are measured will correspond with the property or properties measured for the pattern features of the target portions of the substrates of FIGS. 2 and 3.

Using the measurements described above, it should be possible to see how one or more properties of the pattern features have changed (or remained constant) as a result of changes in the aberration state. Thus, a measure of aberration sensitivity may be determined. However, the described experimental method may not be satisfactory for a number of reasons.

One possible reason for the method described above in relation to FIGS. 2 to 4 being unsatisfactory is the amount of time taken to perform the method. In order to obtain multiple data points for changes in aberration state, multiple substrates are used. Typically, if 'x' number of aberration states are to be used in the determination of the aberration sensitivity, 'x' substrates are used, one for each aberration state. Even if only two aberration states are to be used to determine a measure of aberration sensitivity, a significant amount of time (relative to an exposure) will be required to: unload a first substrate on which pattern features have been provided; load, expose, and unload a second substrate for a different aberration state; and to then to repeat such loading and unloading in any measurement tool. Of course, it may be desirable to obtain more than two data points to determine a trend in aberration sensitivity more accurately, particularly if the trend is non-linear. Thus, to obtain 10, 20, 30 or more changes in aberration state, 10, 20, 30 or more substrates are used, with the associated loading, exposing, and unloading times. This is clearly a time consuming and inefficient process, and leaves the lithographic apparatus unavailable for production during that process.

Using more than one substrate to determine aberration sensitivity leads to another reason why the above-described method may be unsatisfactory. Each time a substrate is loaded into a lithographic apparatus, some form of alignment will take place, for example between a patterning device of the lithographic apparatus and the substrate itself, or a target portion of that substrate. Such alignment may never be exact. Furthermore, an alignment process may make use of an optical system. The optical system may exhibit an aberration, and this aberration itself may cause a problem with (e.g. inaccuracy or inconsistency) alignment. Thus, there may be a small but significant displacement between the positions of different substrates used in different exposures in the determination of aberration sensitivity. This is significant because aberrations in the lithographic apparatus may themselves cause displacement of pattern features applied to a substrate. Thus, in at least some instances, it may be difficult to determine whether a change in displacement of a pattern feature was a result of a sensitivity to a certain aberration, or simply an error (or at least a difference) in the alignment of that particular substrate relative to another substrate.

According to an embodiment of the present invention, it has been realized that one or more of the problems associated with the foregoing experimental method can be largely overcome. In an embodiment, rather than multiple substrates being used for the same multiple number of different aberration states, the aberration state of a lithographic apparatus may be changed for the application of pattern features to different target portions of a single substrate. More specifically, an embodiment of the present invention relates to a lithographic method of determining a sensitivity of a property of a pattern feature applied to a substrate to changes in optical aberrations of a lithographic apparatus used to apply that pattern feature (i.e. aberration sensitivity). In more detail, the method comprises controlling a configuration of the lithographic apparatus to establish a first aberration state. A pattern feature is applied to a first target portion of the substrate when the lithographic apparatus is in that first aberration state. Next, a configuration of the lithographic apparatus is controlled to establish a second, different (to the first), aberration state. A pattern feature is then applied to a second, different, target portion of the same substrate (i.e. not a different substrate) when the lithographic apparatus is in that second aberration state. A property of the pattern feature applied to the first target portion of the substrate is then measured. A same property (for comparison) of the pattern feature applied to the second target portion of the substrate is then measured. The measurements are then used (e.g. by comparison, plotting, further calculation or the like) to determine a sensitivity of a property of the pattern feature to change in the aberration state—i.e. the measurements are used to determine an aberration sensitivity.

The aberration state of the lithographic apparatus may be described, alternatively and/or additionally, as the apparatus being in a state which exhibits or provides a certain aberration. Desirably, the aberration state will be predictable and/or quantifiable, in order to assist in a numerical definition or determination of the aberration sensitivity. It may be possible to implement the method without such predictability or quantifiability, for example by instead knowing a start and end point of an aberration and how the variation in that aberration affects a property of a pattern feature. However, predictability and quantifiability add accuracy and repeatability to the method. The predictable and/or quantifiable nature of the aberration state may be a magnitude for and/or type of aberration constituting that aberration state. If quantifiable or predictable, the aberration state, or the aberration constituting that state, might be known prior to application of a pattern feature to a target portion of the substrate, so that a desired aberration or aberration state may be used as a particular starting point, end point, or data point in general, in the determination of aberration sensitivity.

Embodiments of the present invention will now be described with reference to FIGS. 5 and 6.

Figure 5:
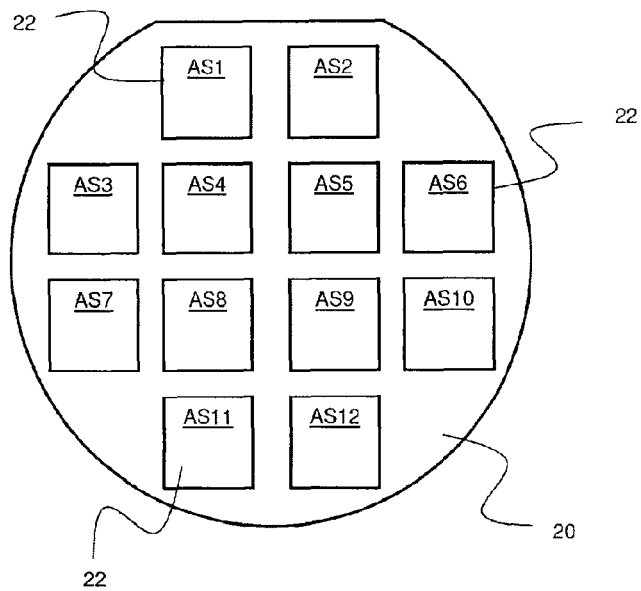
FIG. 5 schematically depicts a plan view of a substrate, and principles associated with the determination of aberration sensitivity in accordance with an embodiment of the present invention.
Figure 6:
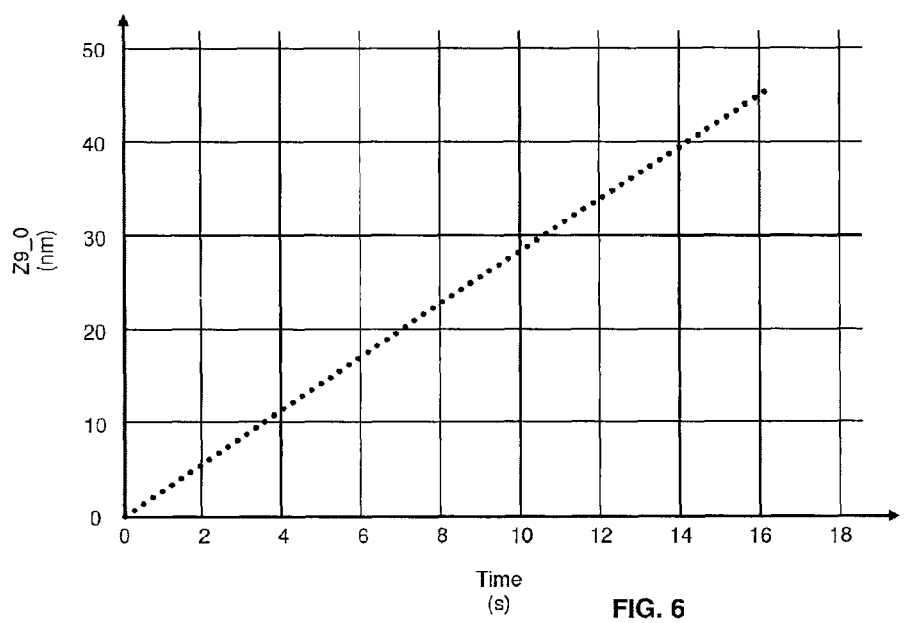
FIG. 6 schematically depicts a graph showing a change in magnitude of an aberration over a period of time that may be used in accordance with an embodiment of the present invention.

Referring to FIG. 5, a plan view of a substrate 20 is shown. A lithographic method of determining an aberration sensitivity is undertaken using that single substrate 20. A lithographic apparatus (for example the lithographic apparatus shown in FIG. 1) is used to apply pattern features to each of one or more target portions 22 (e.g. dies) of the substrate 20.

Initially, a configuration of the lithographic apparatus is controlled to establish a first aberration state AS1. A pattern feature is applied to a first target portion of the substrate 20 when the lithographic apparatus is in that first aberration state AS1.

The aberration state of the lithographic apparatus during the application of a pattern feature to a particular target portion 22 is denoted in the Figure by AS1 for a first aberration state, AS2 for a second aberration state, AS3 for a third aberration state and so on, as will be described in more detail below.

Controlling of the configuration of the lithographic apparatus may comprise deforming one or more elements of a lens arrangement of the lithographic apparatus, moving one or more elements of a lens arrangement of the lithographic apparatus, and/or thermally controlling (e.g., heating) one or more portions of the lens arrangement, which are approaches to the control of aberrations/aberration states in a lithographic apparatus. Moving of the one or more elements includes changing the position or orientation of such elements (e.g. by tilting). Controlling of the configuration of the lithographic apparatus may, alternatively or additionally, comprise moving a patterning device or a part thereof (which includes changing the position or orientation of such device, or a part thereof (e.g. by tilting), adjusting the wavelength of the radiation beam, and/or changing an optical property of liquid used in the optical path.

The aberration state may comprise: an even aberration or an odd aberration. The aberration state may comprise or be defined by a specific aberration in terms of Zernike polynomials, such as lower order coma aberration. The aberration state may comprise or be defined by a combination of multiple Zernike polynomials. Odd aberrations relate to the affecting of in plane placement/displacement and asymmetries. Even aberrations relate to the affecting of out of plane placement/displacement (e.g. focus/defocus related aberrations) and asymmetries. The aberration state may comprise or be defined by specific aberrations, which may comprise or be defined by Zernike coefficients or polynomials. The aberration state may alternatively or additionally be controlled to provide specific field distributions, for example: an offset, a tilt, a curvature, or the like.

Subsequently, a configuration of the lithographic apparatus is controlled to establish a second, different, aberration state AS2. A difference between the first aberration state and the second, different, aberration state AS2 may be a difference in magnitude and/or type of aberration constituting the first and second aberration states. It is perhaps more likely that the difference will be a difference in magnitude for a given aberration, which may allow a trend in aberration sensitivity for that aberration to be determined. The method may be repeated for different types of aberrations (possible on a different set of target portions of the same substrate). The aberration may increase or decrease in magnitude between the first aberration state and a second aberration state. The aberration state may be varied in a continuous manner to provide the first aberration state, and, subsequently and at a later time the second, different, aberration state. Alternatively, the controlling of the configuration of the lithographic apparatus may comprise discretely varying the aberration state to provide the first aberration state and, a later time, the second, different, aberration state.

In a continuous variation of the aberration state, a 'fixed' aberration state may be obtained by the application of a pattern to the substrate in a short period of time relative to the rate of change of the aberration state, thereby fixing the aberration state for the application of the pattern feature to that target portion of the substrate. When discretely varying the configuration of the lithographic apparatus, the variation may be undertaken discretely in a step-wise manner or the like for consecutive target portions (e.g. dies) of the substrate.

When the lithographic apparatus is in the second aberration state AS2, a pattern feature is applied to a second, different target portion of the same substrate 20.

The process of controlling the configuration of the lithographic apparatus to establish a different aberration state, and subsequently applying a pattern feature to a different target portion of the substrate when the apparatus is exhibiting that aberration state, may be repeated any number of times. For example, FIG. 5 shows that pattern features have been applied to each of twelve different target portions 22 of the substrate 20, each different target portion being provided with a pattern feature when the apparatus is in one of twelve different aberration states AS1-AS12. Twelve target portions and twelve aberration states are shown by way of example only. Fewer than twelve aberration states may be used to determine, or more accurately determine, aberration sensitivity. Alternatively, a greater number of aberration states may be used to determine, or more accurately determine, aberration sensitivity, in particular if the aberration sensitivity is non-linear.

The number of aberration states may be limited by the ability to control the configuration of the lithographic apparatus to exhibit those different aberration states, and/or by the inadvertent introduction of additional (parasitic) aberrations. However this limitation may be avoided or overcome. In accordance with an embodiment of the present invention, there is a required aberration state and a realized aberration state. A required aberration state may, when realized (i.e. implemented), introduce or be associated with additional (e.g. parasitic) aberrations. The applied pattern feature might be sensitive to all of these aberrations (e.g. including the parasitic aberrations). By applying pattern features to target portions for different magnitudes of a given required aberration, and then measuring properties of those pattern features, information relating to the realized aberration state and the parasitic aberration may be obtained. If it is assumed that any effects due to the parasitic aberrations are linear (which is to be expected for small, parasitic aberration levels), then a basis transformation can be performed, based upon the realized aberration state, thus allowing a sensitivity to the required aberration state (i.e. excluding the parasitic additions) to be extracted.

Alternatively or additionally, the number of aberration states that may be used in the determination of the aberration sensitivity may be limited by the number of target portions that are available on the substrate. For instance, the number of target portions may be limited by the size of the substrate, or the available patternable area of the substrate, for example a number of dies that are or would be available using that substrate. For instance, the number of target portions (e.g. dies) may be at least 5, 10, 15, 20, 50, 100, 200 or more, which may allow the same number of aberration states to be used to determine aberration sensitivity. In one example, a pattern feature may be applied to more than one target portion of a substrate when the lithographic apparatus exhibits a given aberration state. This may allow a subsequent measurement to be verified using those different target portions, for an even more accurate or reliable determination of aberration sensitivity.

Once all the desired target portions have been provided with pattern features when the lithographic apparatus was in a correspondingly appropriate number of different aberration states, one or more of the same properties of the pattern features applied to the substrate will be measured. For example, a property of a pattern feature applied to the first target portion of the substrate may be measured and a same property of the pattern feature applied to the second, different target portion of the substrate may be measured (and so on, for all different target portions and/or aberration states used to provide those target portions). The measurements may then be used to determine a sensitivity of the property of the pattern feature to change in the aberration state. Measurements may be undertaken by a measurement tool, for example an optical inspection tool.

The property that is measured may be, for example, one or more selected from: a sharpness of the pattern feature, a dimension of the feature, a shape for the pattern feature, and/or a position of the pattern feature. Changes of one or more of these properties may be linked to changes in the magnitude and/or type of aberration constituting the different aberration states that the lithographic apparatus has been controlled to exhibit.

The substrate shown in FIG. 5 may be a test (or in other words reference) substrate, not necessarily used in the manufacture of devices or the like. For instance, it may not be desirable to change the aberration state for different target portions of a production substrate, since such changes are known to affect the pattern features applied to that substrate.

The method described above may be used, or be further used, as part of an aberration control loop. The control loop would comprise using the determined aberration sensitivity to, subsequently, control an aberration state of the lithographic apparatus during the subsequent application of patterns to a different substrate. For example, the different substrate might be a production substrate. The aberration sensitivity that has previously been determined may be used to help ensure that the aberrations of the lithographic apparatus are properly controlled or minimized during the application of patterns to that substrate. Alternatively or additionally, the aberration sensitivity that has previously been determined may be used to at least help ensure that patterns are applied to a substrate in a more accurate or consistent manner. Alternatively or additionally, the aberration sensitivity might be used to calculate (i.e. in advance of the application of a pattern feature) the response of a pattern feature that might be applied to a substrate to a particular aberration. This might be used in an additional or different implementation of a control loop—i.e. using the aberration sensitivity to calculate what effect an aberration might have on a pattern feature, and controlling a configuration of a lithographic apparatus to control that effect when the pattern feature is actually applied to a substrate.

In order to implement an embodiment of the present invention, the lithographic apparatus has a configuration that can be controlled to change the aberration state, and desirably to a quantifiable and/or predictable aberration state (in terms of a magnitude and/or a type of aberration constituting that aberration state). The nature of the control, the type of control, the type of aberration, the type of change in aberration, and the like, may be any now known or known in the future. As already discussed above, the aberration state may be controlled by controlling the configuration (e.g. position, orientation, heating (i.e. temperature), refractive index, or the like) of one or more elements constituting a lens arrangement of the lithographic apparatus (or any other arrangement of the apparatus). Other ways of achieving or describing such a change in configuration may be by appropriate tuning or de-tuning of the lens arrangement, for example by applying a Zernike process correction per exposure, which may be an aberration offset to an optimal lens aberration state. In other examples, process corrections may be undertaken to change the aberration state. By way of example only, an example of how an aberration state may be controlled will now be described.

A controller of a lithographic apparatus may utilize an optical element thermal (e.g., lens heating) control algorithm. The algorithm may contain two components. A first component might relate to a prediction of an optical element thermal effect (e.g. heating due to transmission or reflection of a radiation beam used in the application of patterns) based upon knowledge on how lens aberrations change upon usage. This knowledge is used to formulate a set of time constants ($\tau$) and scaling factors ($\mu$). A second component might relate to a compensation model which, based upon the predicted optical element thermal effect, calculates one or more optimal set points for one or more optical element actuators. This results in optical element adjustment (e.g. movement of one or more appropriate actuators), and a reporting of a residual aberration state of the system. However, this algorithm, and its implementation, can be taken advantage of to implement an embodiment of the present invention—i.e. to provide a desired aberration state. Specifically, the algorithm, and specifically the compensation model component thereof, can be provided with optical element thermal (e.g., lens heating) information that is not indicative of a correction for an aberration, but is instead specifically chosen to result in the introduction or establishment of a desired aberration state.

In one example, optical element thermal (e.g., lens heating) induced aberrations may be realized in accordance with the following equation, which is an empirical equation describing the dynamics of lens heating induced aberrations (based on a projection lens model):

$$Zn\_k(t) = \mu1(1-\exp(-t/\tau1)) + \mu2(1-\exp(-t/\tau2))$$

Where:

Zn is the nth Zernike (n is typically equal to 2-25);

k is the order of polynomial fit of Zn across an exposure slit of a projection lens model (k is typically equal to 1-4);

$\mu1$ and $\mu2$ are scaling factors;

$\tau1$ and $\tau2$ are time constants; and t is time (in seconds).

A certain aberration, which is changing in time, can be induced by varying the value of $\mu1$ and/or $\mu2$, and/or $\tau1$ and/or $\tau2$. For example, with aberration Z9_0, and by setting $\mu1=128$, $\mu2=150$, $\tau1=80$ seconds, $\tau2=800$ seconds, around 40 nm of almost linearly drifting Z9_0 can be achieved within 15 seconds, which is a typical exposure time for all target portions (dies) of a single typical substrate. This drift is shown in the graph of FIG. 6. Thus, different aberration states may be employed in the provision of one or more patterns features to different target portions over this period of time, in a quantifiable and predictable manner. Measuring a change in property of the applied pattern features for the different aberration states will allow an aberration sensitivity to be determined.

In the embodiments described thus far, a method has been described in which pattern features are applied to a substrate. However, in a related embodiment pattern features might be imaged in order to determine an aberration sensitivity. According to aspect or embodiment of the present invention a lithographic method of determining a sensitivity of a property of a pattern feature to changes in optical aberrations of a lithographic apparatus used to provide that pattern feature is provided. The method comprises: controlling a configuration of the lithographic apparatus to establish a first aberration state, and forming a first image of the pattern feature with that lithographic apparatus when the lithographic apparatus is in that first aberration state (e.g. on a sensor), and measuring a property of the image (e.g. with that sensor). The method further comprises controlling a configuration of the lithographic apparatus to establish a second, different, aberration state, and forming an image of the same pattern feature with that lithographic apparatus when the lithographic apparatus is in that second aberration state (e.g. on a sensor), and measuring a same property of the image (e.g. with that sensor). The method further comprises using the measurements to determine the sensitivity of the property of the pattern feature to changes in the aberration state. For instance, a pattern feature may be imaged on to a sensor constituting a part of the lithographic apparatus. The pattern feature may be a pattern feature that is to be applied to a substrate, or could instead be an alignment mark. The image formed might be an aerial image. If, for example, no pattern feature is provided on a substrate, but instead is imaged on to a sensor, the pattern feature that is measured might additionally and/or alternatively be related to an intensity of radiation forming that image.

This related aspect might be implemented in much the same way as described above in relation to the application of pattern features to a substrate. The related aspect might be used as an internal control loop for the lithographic apparatus, whereas the initially described aspect might be used as an external control loop (since measurements are undertaken of the effect of the aberrations on an external entity—the pattern features formed on the substrate). The external control loop might be preferred, since it can take into account practical, physical results in the form of the measured properties of applied pattern features.

According to a related aspect, an assembly may be provided to implement at least a part of the above-described method. In particular, a lithographic assembly may be provided that comprises: an illumination system to condition a radiation beam; a patterning device to impart the radiation beam with a pattern in its cross-section; a substrate holder to hold a substrate; and a projection system to project the patterned radiation beam onto a target portion of the substrate. A controller is also provided, the controller being constructed and arranged to, in use, control a configuration of the lithographic assembly (e.g. a configuration of a lens arrangement, which include a position, orientation and/or degree of thermal change (e.g., heating) of one or more parts of that arrangement). The control is undertaken to establish a first aberration state for the application of a pattern feature to a first target portion of the substrate when the lithographic assembly is in that first aberration state. Further control is undertaken to control a configuration of the lithographic assembly to establish a second, different, aberration state for the application of a pattern feature to a second, different, target portion of the same substrate when the lithographic assembly is in that second aberration state. The assembly might comprise a lithographic apparatus having the aforementioned features, and other apparatus. The other apparatus may comprise a measuring tool (e.g. an optical inspection tool) to measure a property of the pattern feature applied to substrate. A processing arrangement may be provided to determine an aberration sensitivity using the measurements. A store (e.g. memory) may be provided to store an aberration sensitivity (or library of such sensitivities) for use in subsequent application of patterns. The controller may comprise, or be part of the same apparatus as, one or more of the processor and store, and for example may be a computer or the like.

The controller may be constructed and arranged to, in use, control a configuration of the lithographic assembly in accordance with any embodiment or aspect described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of, or be at least partially implemented using, a computer program containing one or more sequences of machine-readable instructions describing a method as disclosed above, or a data storage medium (e.g. semiconductor memory, magnetic or optical disk) having such a computer program stored therein.

The invention may further be described using the following clauses:

1. A lithographic method of determining a sensitivity of a property of a pattern feature to change in optical aberration of a lithographic apparatus used to provide that pattern feature, the method comprising:

controlling a configuration of the lithographic apparatus to establish a first aberration state, and forming a first image of the pattern feature with that lithographic apparatus when the lithographic apparatus is in that first aberration state;

measuring a property of the image;

controlling a configuration of the lithographic apparatus to establish a second, different, aberration state, and forming an image of the same pattern feature with that lithographic apparatus when the lithographic apparatus is in that second aberration state;

measuring a same property of the image; and using the measurements to determine the sensitivity of the property of the pattern feature to change in the aberration state.

2. The lithographic method of clause 1, wherein the pattern feature is a pattern feature that has been, or is to be applied to, a substrate, such that the method comprises:

controlling the configuration of the lithographic apparatus to establish the first aberration state, and applying the pattern feature to a first target portion of the substrate when the lithographic apparatus is in that first aberration state;

controlling the configuration of the lithographic apparatus to establish the second, different, aberration state, and applying the pattern feature to a second, different, target portion of the same substrate when the lithographic apparatus is in that second aberration state;

measuring a property of the pattern feature applied to the first target portion of the substrate;

measuring a same property of the pattern feature applied to the second target portion of the substrate; and using the measurements to determine the sensitivity of the property of the pattern feature to changes in the aberration state.

3. The lithographic method of clause 1 or clause 2, wherein an aberration constituting the first and/or second aberration state is quantifiable.

4. The lithographic method of any preceding clause, wherein a type and/or magnitude of an aberration constituting the first and/or second aberration state is predictable, and/or is known prior to application or provision of the pattern feature.

5. The lithographic method of any preceding clause, wherein a difference between the first aberration state and the second aberration state is a difference in a magnitude and/or type of an aberration constituting the first and/or second aberration state.

6. The lithographic method of any preceding clause, wherein the controlling of the configuration of the lithographic apparatus comprises continuously varying the aberration state to provide the first aberration state and, at a later time, the second, different, aberration state.

7. The lithographic method of any of clauses 1 to 5, wherein the controlling of the configuration of the lithographic apparatus comprises discretely varying the aberration state to provide the first aberration state and, at a later time, the second, different, aberration state.

8. The lithographic method of any preceding clause, wherein the controlling of the configuration of the lithographic apparatus comprises moving or deforming an element of a lens arrangement of the lithographic apparatus, or changing a temperature of a portion of the lens arrangement.

9. The lithographic method of any of clauses 2 to 8, wherein the substrate is a test substrate.

10. The lithographic method of any of clauses 2 to 9, when dependent on clause 2, further comprising using the determined sensitivity as part of an aberration control loop.

11. The lithographic method of clause 10, wherein the aberration control loop comprises using the determined sensitivity to control an aberration state of the lithographic apparatus during the subsequent application of patterns to a different substrate.

12. The lithographic method of any of clauses 2-11, when dependent on clause 2, wherein the method is repeated for a third, fourth or fifth aberration state and a corresponding third, fourth or fifth target portion of the substrate, or for at least, in total, 5, 10, 15, 20, 50, 100, 200 or more aberration states and target portions.

13. The lithographic method of any of clauses 2 to 12, when dependent on clause 2, wherein each target portion of the substrate is a die.

14. The lithographic method of any preceding clause, wherein the property is one or more selected from: a sharpness of the pattern feature, a dimension of the pattern feature, a shape of the pattern feature, a position of the pattern feature, and/or an intensity of a part of a pattern feature.

15. The lithographic method of any preceding clause, wherein the aberration state comprise odd aberrations and/or even aberrations.

16. A lithographic method of determining a sensitivity of a property of a pattern feature applied to a substrate to change in optical aberration of a lithographic apparatus used to apply that pattern feature, the method comprising:

controlling a configuration of the lithographic apparatus to establish a first aberration state, and applying a pattern feature to a first target portion of the substrate when the lithographic apparatus is in that first aberration state;

controlling a configuration of the lithographic apparatus to establish a second, different, aberration state, and applying a pattern feature to a second, different, target portion of the same substrate when the lithographic apparatus is in that second aberration state;

measuring a property of the pattern feature applied to the first target portion of the substrate;

measuring a same property of the pattern feature applied to the second target portion of the substrate; and using the measurements to determine the sensitivity of the property of the pattern feature to change in the aberration state.

17. A lithographic assembly comprising:

a substrate holder to hold a substrate;

a projection system to project a patterned radiation beam onto a target portion of the substrate; and a controller constructed and arranged to, in use, control a configuration of the lithographic assembly to establish a first aberration state for the application of a pattern feature to a first target portion of the substrate when the lithographic apparatus is in that first aberration state, and to control a configuration of the lithographic apparatus to establish a second, different, aberration state for the application of a pattern feature to a second, different, target portion of the same substrate when the lithographic apparatus is in that second aberration state.

The descriptions above are intended to be illustrative, not limiting. Thus, it will be apparent to one skilled in the art that modifications may be made to the invention as described without departing from the scope of the claims set out below.

The invention claimed is:

1. A lithographic method of determining a sensitivity of a property of a pattern feature to change in optical aberration of a lithographic apparatus used to image that pattern feature, the method comprising:

controlling a configuration of the lithographic apparatus to establish a first aberration state, and forming a first image of the pattern feature with that lithographic apparatus when the lithographic apparatus is in that first aberration state;

measuring a property of the first image;

controlling a configuration of the lithographic apparatus to establish a second, different, aberration state, and forming a second image of the same pattern feature with that lithographic apparatus when the lithographic apparatus is in that second aberration state;

measuring a same property of the second image; and using the measurements to determine the sensitivity of the property of the pattern feature to change in the aberration state.

2. The lithographic method of claim 1, wherein the pattern feature is a pattern feature that has been, or is to be applied to, a substrate, such that the method comprises:

controlling the configuration of the lithographic apparatus to establish the first aberration state, and applying the pattern feature to a first target portion of the substrate when the lithographic apparatus is in that first aberration state;

controlling the configuration of the lithographic apparatus to establish the second, different, aberration state, and applying the pattern feature to a second, different, target portion of the same substrate when the lithographic apparatus is in that second aberration state;

measuring a property of the pattern feature applied to the first target portion of the substrate;

measuring a same property of the pattern feature applied to the second target portion of the substrate; and using the measurements to determine the sensitivity of the property of the pattern feature to changes in the aberration state.

3. The lithographic method of claim 2, wherein the substrate is a test substrate.

4. The lithographic method of claim 2, further comprising using the determined sensitivity as part of an aberration control loop.

5. The lithographic method of claim 4, wherein the aberration control loop comprises using the determined sensitivity to control an aberration state of the lithographic apparatus during the subsequent application of patterns to a different substrate.

6. The lithographic method of claim 2, wherein the method is repeated for a third, fourth or fifth aberration state and a corresponding third, fourth or fifth target portion of the substrate, or for at least, in total, 5, 10, 15, 20, 50, 100, 200 or more aberration states and target portions.

7. The lithographic method of claim 2, wherein each target portion of the substrate is a die.

8. The lithographic method of claim 1, wherein an aberration constituting the first and/or second aberration state is quantifiable.

9. The lithographic method of claim 1, wherein a type and/or magnitude of an aberration constituting the first and/or second aberration state is predictable, and/or is known prior to application or provision of the pattern feature.

10. The lithographic method of claim 1, wherein a difference between the first aberration state and the second aberration state is a difference in a magnitude and/or type of an aberration constituting the first and/or second aberration state.

11. The lithographic method of claim 1, wherein the controlling of the configuration of the lithographic apparatus comprises continuously varying the aberration state to provide the first aberration state and, at a later time, the second, different, aberration state.

12. The lithographic method of claim 1, wherein the controlling of the configuration of the lithographic apparatus comprises discretely varying the aberration state to provide the first aberration state and, at a later time, the second, different, aberration state.

13. The lithographic method of claim 1, wherein the controlling of the configuration of the lithographic apparatus comprises moving or deforming an element of a lens arrangement of the lithographic apparatus, or changing a temperature of a portion of the lens arrangement.

14. The lithographic method of claim 1, wherein the property is one or more selected from: a sharpness of the pattern feature, a dimension of the pattern feature, a shape of the pattern feature, a position of the pattern feature, and/or an intensity of a part of the pattern feature.

15. The lithographic method of claim 1, wherein the aberration state comprise odd aberrations and/or even aberrations.

* * * * *